United States Patent [19]

Buchenauer

[11] 4,426,620

[45] Jan. 17, 1984

[54] ANALOG QUADRATURE SIGNAL TO PHASE ANGLE DATA CONVERSION BY A QUADRATURE DIGITIZER AND QUADRATURE COUNTER

[75] Inventor: C. Jerald Buchenauer, Los Alamos, N. Mex.

[73] Assignee: The United States of America as represented by the United States Department of Energy, Washington, D.C.

[21] Appl. No.: 304,737

[22] Filed: Sep. 23, 1981

[51] Int. Cl.³ ............................................. G01R 25/00
[52] U.S. Cl. ................................. 324/83 D; 307/511; 328/155; 324/83 Q
[58] Field of Search ........................ 377/123, 125, 126; 328/55, 155, 134; 307/511, 512; 324/83 R, 83 A, 83 D, 83 Q

[56] References Cited

U.S. PATENT DOCUMENTS

| | | | |
|---|---|---|---|
| 2,994,790 | 8/1961 | Delaney | 307/511 |
| 3,391,343 | 7/1968 | McCurdy | 377/126 |
| 3,849,671 | 11/1974 | Molack | 307/511 |
| 3,953,794 | 4/1976 | Moore | 324/83 D |

Primary Examiner—Michael J. Tokar
Attorney, Agent, or Firm—Paul D. Gaetjens; Leonard C. Brenner; Richard G. Besha

[57] ABSTRACT

The quadrature phase angle $\phi(t)$ of a pair of quadrature signals $S_1(t)$ and $S_2(t)$ is digitally encoded on a real time basis by a quadrature digitizer for fractional $\phi(t)$ rotational excursions and by a quadrature up/down counter for full $\phi(t)$ rotations. The pair of quadrature signals are of the form $S_1(t) = k(t) \sin \phi(t)$ and $S_2(t) = k(t) \cos \phi(t)$ where k(t) is a signal common to both. The quadrature digitizer and the quadrature up/down counter may be used together or singularly as desired or required. Optionally, a digital-to-analog converter may follow the outputs of the quadrature digitizer and the quadrature up/down counter to provide an analog signal output of the quadrature phase angle $\phi(t)$.

31 Claims, 20 Drawing Figures

$R_k = R_0 \{ \text{TAN}[2\pi k/2^n] - \text{TAN}[2\pi(k-1)/2^n] \}$ IF $k < N$ $R_k = R_0 \{ 1 - \text{TAN}[2\pi(k-1)/2^n] \}$ IF $k = N$

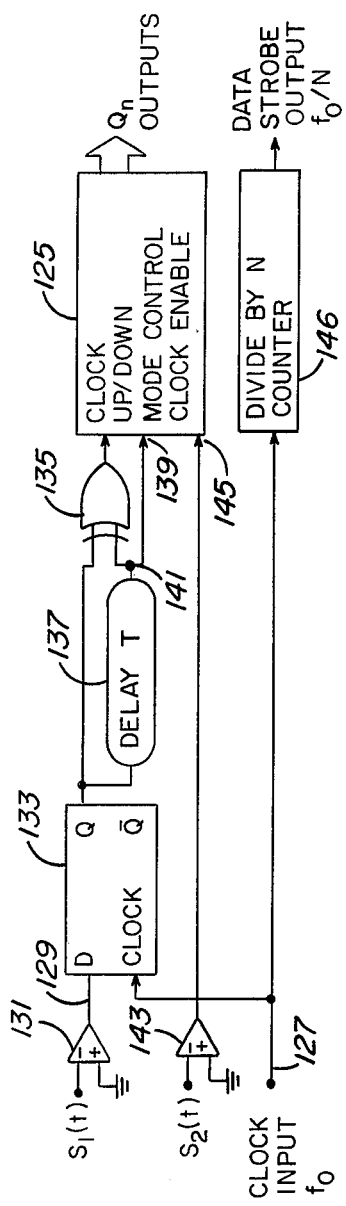
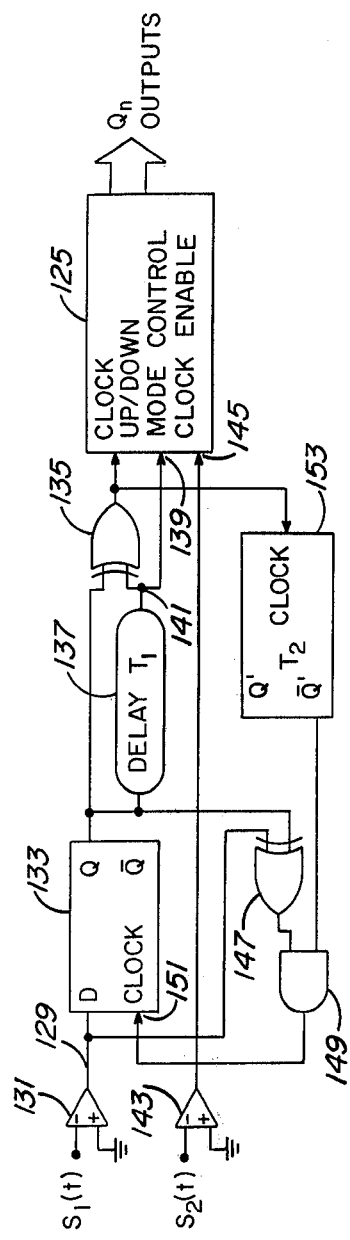
Fig. 15
Fig. 16

4,426,620

ANALOG QUADRATURE SIGNAL TO PHASE ANGLE DATA CONVERSION BY A QUADRATURE DIGITIZER AND QUADRATURE COUNTER

BACKGROUND OF THE INVENTION

This invention is the result of a contract with the Department of Energy (Contract No. W-7405-ENG-36).

The present invention relates to an apparatus for decoding and encoding phase angles of quadrature signals and more particularly for deducing and digitally encoding the phase angle $\phi(t)$ from quadrature signals of the form $S_1(t) = k(t) \sin \phi(t)$ and $S_2(t) = k(t) \cos \phi(t)$ on an extremely fast time scale.

In various types of interferometry and polarimetry, circumstances arise in which a time varying phase angle $\phi(t)$ must be deduced from two experimentally observed signals $S_1(t)$ and $S_2(t)$ of the form given above wherein $k(t)$ is common to both signals, but is of little interest. In such applications the two signals are generally recorded on oscilloscope photographs or converted to digital form by a pair of analog-to-digital converters. The reduction then of the photographic or digital data to deduce $\phi(t)$ is performed either by hand or by computer and requires considerable effort or hardware and cannot be done on a real time basis.

It is therefore an object of the present invention to provide an apparatus for deducing phase angles of quadrature signals on an extremely fast time scale.

It is a further object of the present invention to deduce and digitally encode the phase angle of a quadrature signal on a real time basis.

SUMMARY OF THE INVENTION

To achieve the foregoing and other objects, and in accordance with the purposes of the present invention, as embodied and broadly described herein, the apparatus of this invention may comprise digitizing circuitry to deduce and digitally encode the phase angle of a quadrature signal. The digitizing circuitry comprising a quadrature flash digitizer to digitally encode the fractional portion of the quadrature phase angle representing less than a full rotation and in parallel operation, a quadrature up/down counter to digitally encode the integer portion of the quadrature phase angle representing an integer number of full rotations. In order to reduce component count, circuit complexity and cost at the sacrifice of digitizing speed, the quadrature flash digitizer may be, if desired, fashioned as a first quadrature flash digitizer for encoding the most significant bits of the quadrature phase angle and for subtracting the same therefrom to derive a quadrature partial resultant and a second quadrature flash digitizer for encoding the least significant bits, the second quadrature flash digitizer operating upon the derived quadrature partial resultant.

The present invention may also include in accordance with its objects and purposes, a digital-to-analog converter at its output to convert the deduced quadrature phase angle from digital form to analog form.

One advantage of the present invention is that quadrature phase angles are deduced automatically with a minimum of electronic hardware, complexity, and cost.

Another advantage of the present invention is that quadrature phase angles are deduced on a real time basis.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 15 is a circuit diagram of a clocked quadrature counter circuit employing a standard up/down counter;

FIG. 16 is a circuit diagram of a free-running quadrature counter circuit employing a standard up/down counter;

DETAILED DESCRIPTION OF A PREFERRED EMBODIMENT OF THE INVENTION

Considering now quadrature signals $S_1(t)$ and $S_2(t)$ having a common time-varying phase angle $\phi(t)$ and a common function $k(t)$ of generally little interest, the quadrature signals may be expressed as follows:

$$S_1(t) = k(t) \sin \phi(t)$$

$$S_2(t) = k(t) \cos \phi(t)$$

The present invention deduces and digitally encodes $\phi(t)$ on a very fast time scale.

An arbitrary positive angle $\phi$ may be written as:

$$\phi = 2\pi \sum_{n=-\infty}^{\infty} 2^n Q_n \text{ (radians)}$$

where the n's are integers, and the $Q_n$'s have values of either 0 or 1. The $Q_n$'s are thus in effect the digits or bits of a binary number that describes the angle in units of full rotations. The bits to the left of the decimal point ($n \geq 0$) give the integral number of rotations, whereas those to the right of the decimal point ($n < 0$) give the remaining fractional rotation.

Figure 1:
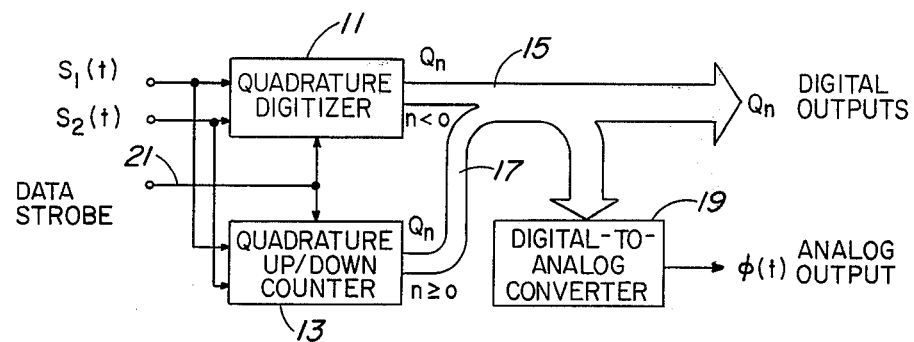
FIG. 1 is a block diagram of the apparatus of the present invention showing a quadrature flash digitizer deducing and digitizing the bits $Q_n$ for $n<0$ representing the fractional portion of the phase angle $\phi(t)$ of quadrature signals $S_1(t)$ and $S_2(t)$ and a quadrature counter deducing and digitizing the bits $Q_n$ for $n \geq 0$ representing the integer portion of the phase angle $\phi(t)$.

The hardware for physically implementing the deducing and digital encoding of the quadrature phase angle involves two major components, a quadrature digitizer 11 for fractional phase angle rotation and a quadrature up/down counter 13 for integral phase angle rotation, see FIG. 1. Input quadrature signals $S_1(t)$ and $S_2(t)$ are fed in parallel to a quadrature digitizer 11 and a quadrature counter 13. The output 15 of the quadrature digitizer 11 carries the binary digits $Q_n$ for $n<0$ representing a fractional rotation of quadrature phase angle $\phi(t)$. The output 17 of the quadrature counter 13 carries the binary digits $Q_n$ for $n \geq 0$ representing integral rotations of the quadrature phase angle $\phi(t)$. If desired, the outputs 15 and 17 may be combined and fed to a digital-to-analog converter 19 to generate the analog output of the quadrature phase angle $\phi(t)$. Also if desired an optional data strobe input 21 may be provided for both the quadrature digitizer 11 and the quadrature counter 13.

Figure 2:
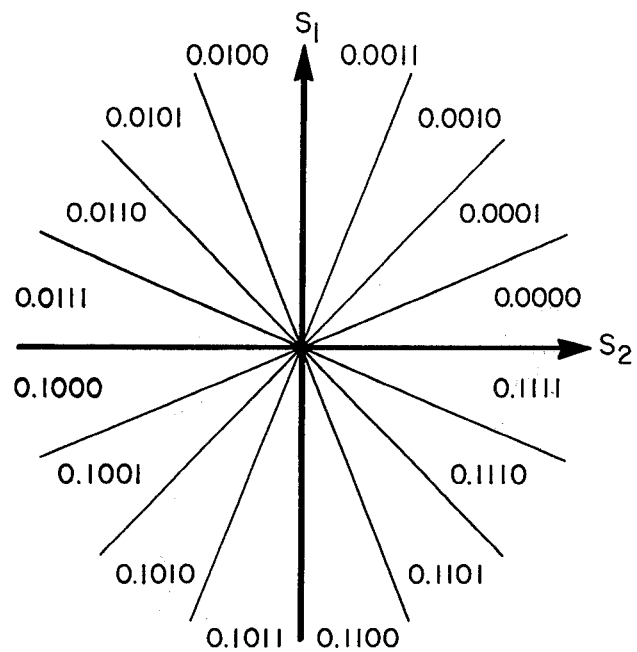
FIG. 2 illustrates the encoding of the four most significant bits of $\phi(t)$ for a fractional rotation in the $S_1$-$S_2$ plane.

The implementations for fractional quadrature phase angle rotation will be discussed first followed by a detailing of the implementations of a quadrature up/down counter. The encoding of fractional rotation in the $S_1$-$S_2$ plane is readily accomplished as illustrated in FIG. 2 for the four most significant bits. The technique of encoding of fractional rotation as shown in FIG. 2 may be expanded to any desired number of significant bits or required resolution.

Figure 3:
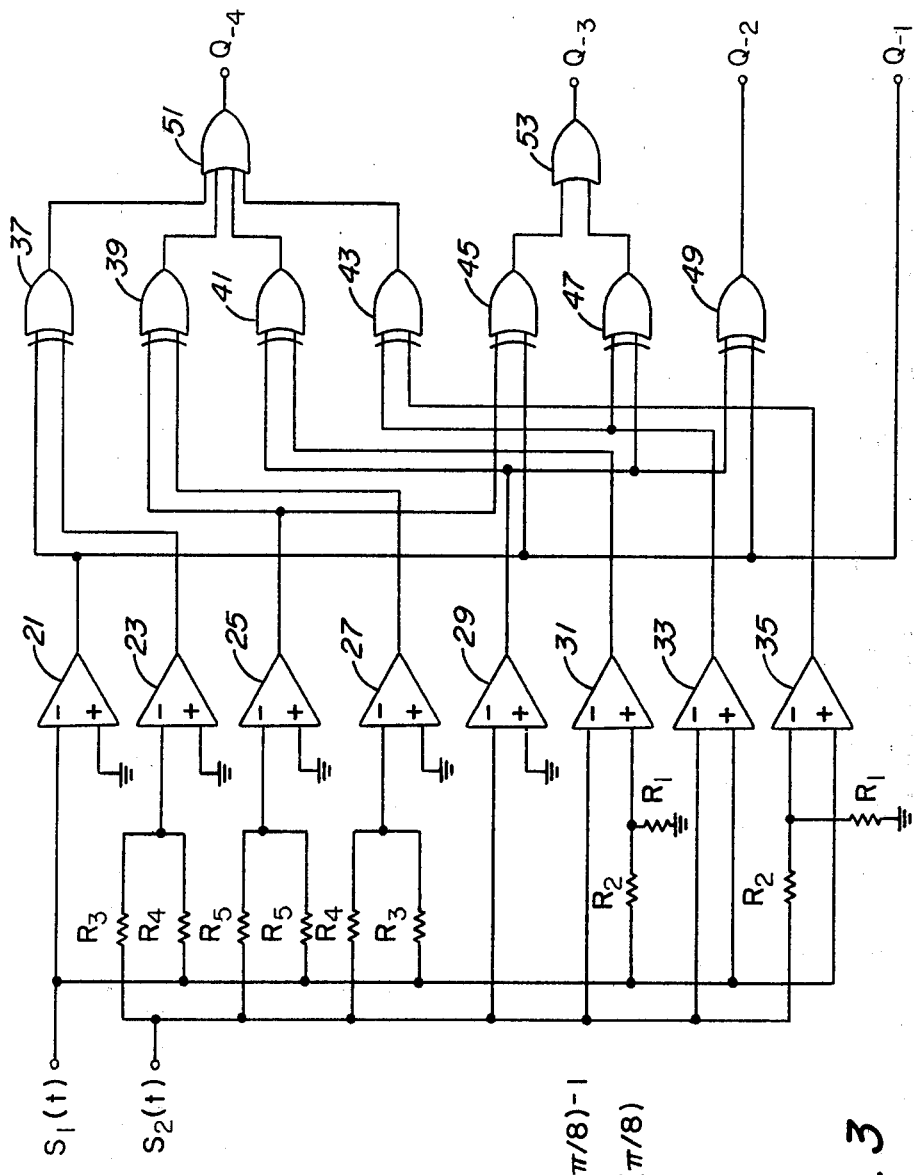
FIG. 3 is a circuit diagram of a four-bit quadrature flash digitizer.

Before considering the implementation of a generalized quadrature digitizer 11 it should prove helpful to consider the implementation of a particular quadrature digitizer for digitizing four bits, see FIG. 3. The quadrature digitizer implementation shown in FIG. 3 and preferably used in the subject invention is a quadrature flash digitizer implementation. A characterizing feature of a true flash digitizer is that the response time of the device is determined only by the propagation delays through the parallel system of comparators and gates. Thus flash digitizers provide extremely fast analog-to-digital conversion. A quadrature digitizer can specify the phase angle $\phi$ to an accuracy of one part in $2^n$ of a full rotation of $2\pi$ radians. Thus, the quadrature digitizer of four bits shown in FIG. 3 can specify the phase angle to an accuracy of one part in 16 of a full rotation. The quadrature signals $S_1(t)$ and $S_2(t)$ are fed through a combination of resistors $R_1$ through $R_5$ (selected as shown in FIG. 3) to a plurality of parallel comparators 21, 23, 25, 27, 29, 31, 33, and 35. The outputs of these comparators are fed in turn to a plurality of parallel exclusive OR gates 37, 39, 41, 43, 45, 47, and 49 which feed in turn the OR gates 51 and 53 to generate a four bit quadrature output $Q_{-1}$, $Q_{-2}$, $Q_{-3}$, and $Q_{-4}$.

Figure 4:
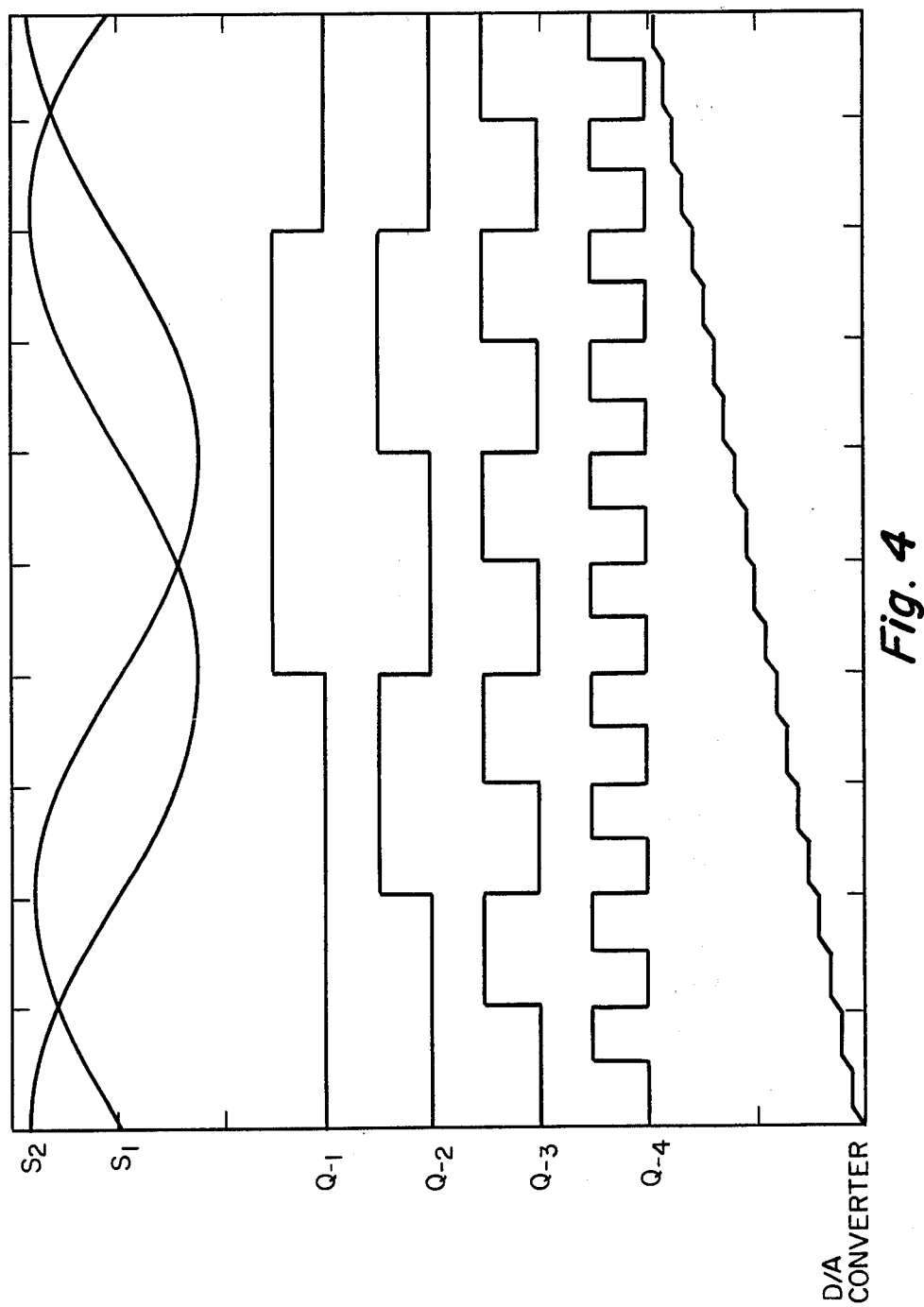
FIG. 4 is a timing diagram of the outputs generated by the four-bit quadrature digitizer of FIG. 3.

The functioning of FIG. 3 with respect to input quadrature signals $S_1(t)$ and $S_2(t)$ as shown in FIG. 4. Also shown in FIG. 4 is the output of the optional digital-to-analog converter 19 fed by the quadrature digitizer 11 of FIG. 3 and the quadrature counter 13 as shown in FIG. 1.

Obviously, all applications do not require or are not satisfied by a four bit quadrature digitizer. Generalized techniques may be followed to construct a quadrature digitizer of any size.

Considering now the method and apparatus for quadrature digitizing, it is appreciated that the value of the n'th bit $Q_{-n}$ to the right of the decimal point ($n>0$) can be expressed by the following Boolean function:

$$Q_{-n} = \bigcup_{k=1}^{2^{n-1}} \overline{C}_{2k} \cdot C_{2k-1}$$

where the $C_k$'s are the two valued Boolean variables given by $C_k = 1$ if $S_1(t) \cos (2\pi k/2^n) > S_2(t) \sin (2\pi k/2^n)$ $C_k = 0$ otherwise.

Since the $C_k$ variables satisfy the relationship $C_k = \overline{C}_{k+2^{n-1}}$ except for trivial cases of no practical consequence the values for $Q_{-n}$ may be expressed as:

$$Q_{-n} = \bigcup_{k=1}^{2^{n-2}} \overline{C}_{2k} \cdot C_{2k-1} \cup C_{2k} \cdot \overline{C}_{2k-1}$$

$$Q_{-n} = \bigcup_{k=1}^{2^{n-2}} C_{2k} \oplus C_{2k-1}$$

where $\oplus$ equals the "exclusive OR" operation.

Figure 5:
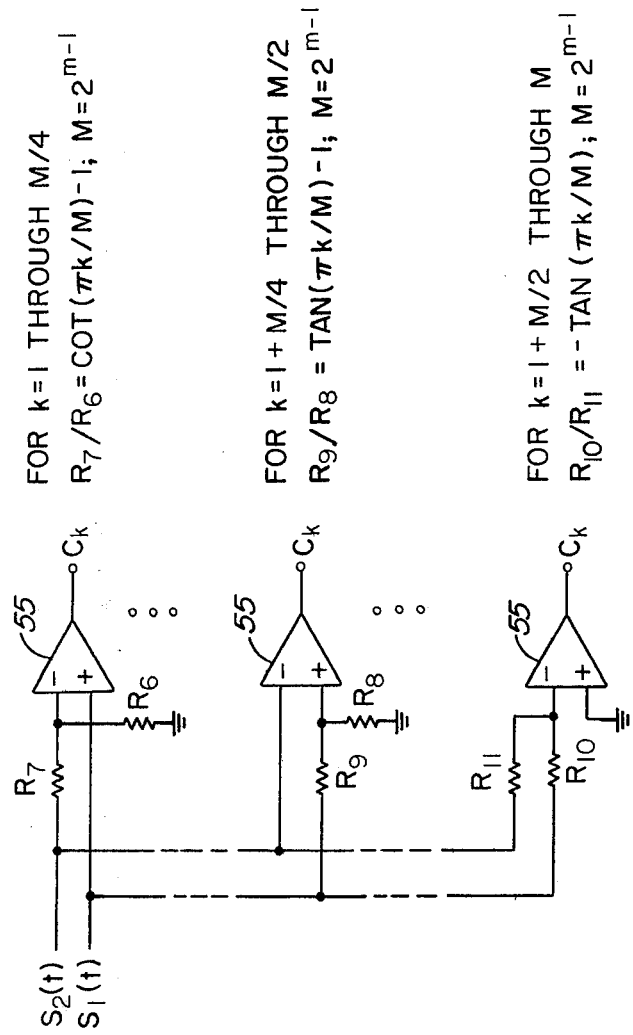
FIG. 5 is a circuit diagram of a circuit for generating intermediate values used in a generalized n bit digitizer.
Figure 6:
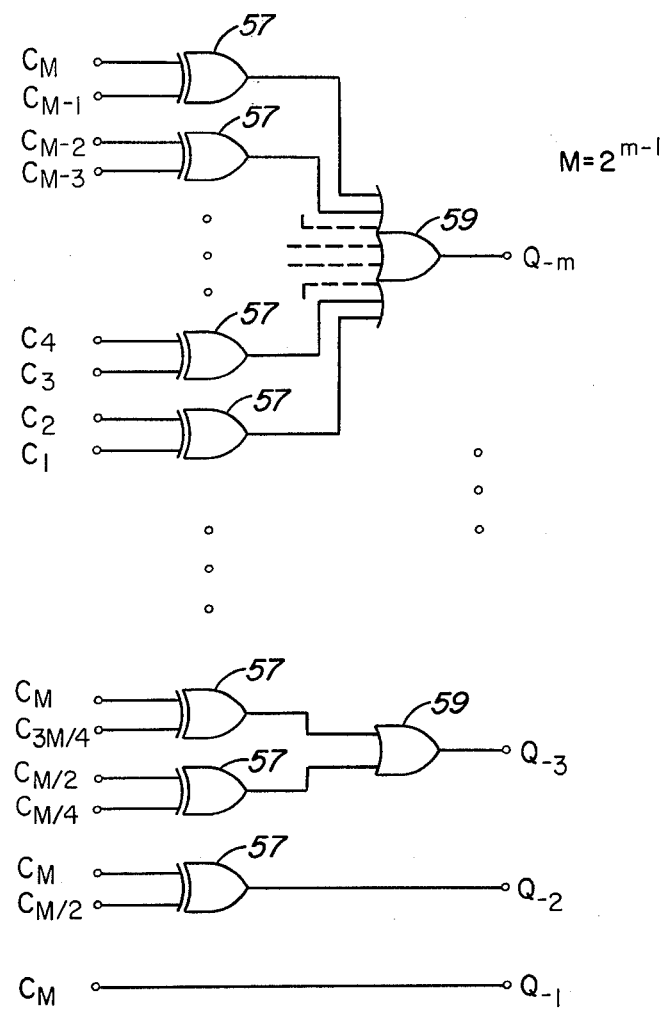
FIG. 6 is a logic diagram of a generalized n bit digitizer using the intermediate values generated by the circuit of FIG. 5.

The construction of an m bit quadrature digitizer in accord with the above Boolean function equations is shown in FIGS. 5 and 6. In FIG. 5 the quadrature signals $S_1(t)$ and $S_2(t)$ are fed to a plurality of parallel comparators 55 to generate the interim values designated $C_k$. The values of $C_k$ for values of k ranging from 1 through M are used as shown in FIG. 6 as inputs to a plurality of parallel exclusive OR gates 57 feeding in turn a plurality of OR gates 59 to generate as outputs therefrom the digital values of the quadrature phase angle $Q_{-1}$, $Q_{-2}$, $Q_{-3}$, to $Q_{-m}$.

For a single stage quadrature digitizer, digitizing n bits as shown in FIG. 1 it is clear that m would then equal n. However, as can be seen from FIGS. 5 and 6, the quadrature digitizer becomes extremely complex as the value of n increases. The number of components required for digitizing with high resolution can be decreased by using a two-stage quadrature digitizer wherein the first stage digitizes m bits and the second stage digitizes n=m bits wherein m is equal to 3 or greater and n−m is approximately equal to m. As was done in the above discussion regarding a single stage quadrature digitizer, a specific two-stage quadrature digitizer having a first and a second stage, each digitizing four bits will be discussed prior to a discussion of a generalized two-stage quadrature digitizer.

Figure 7:
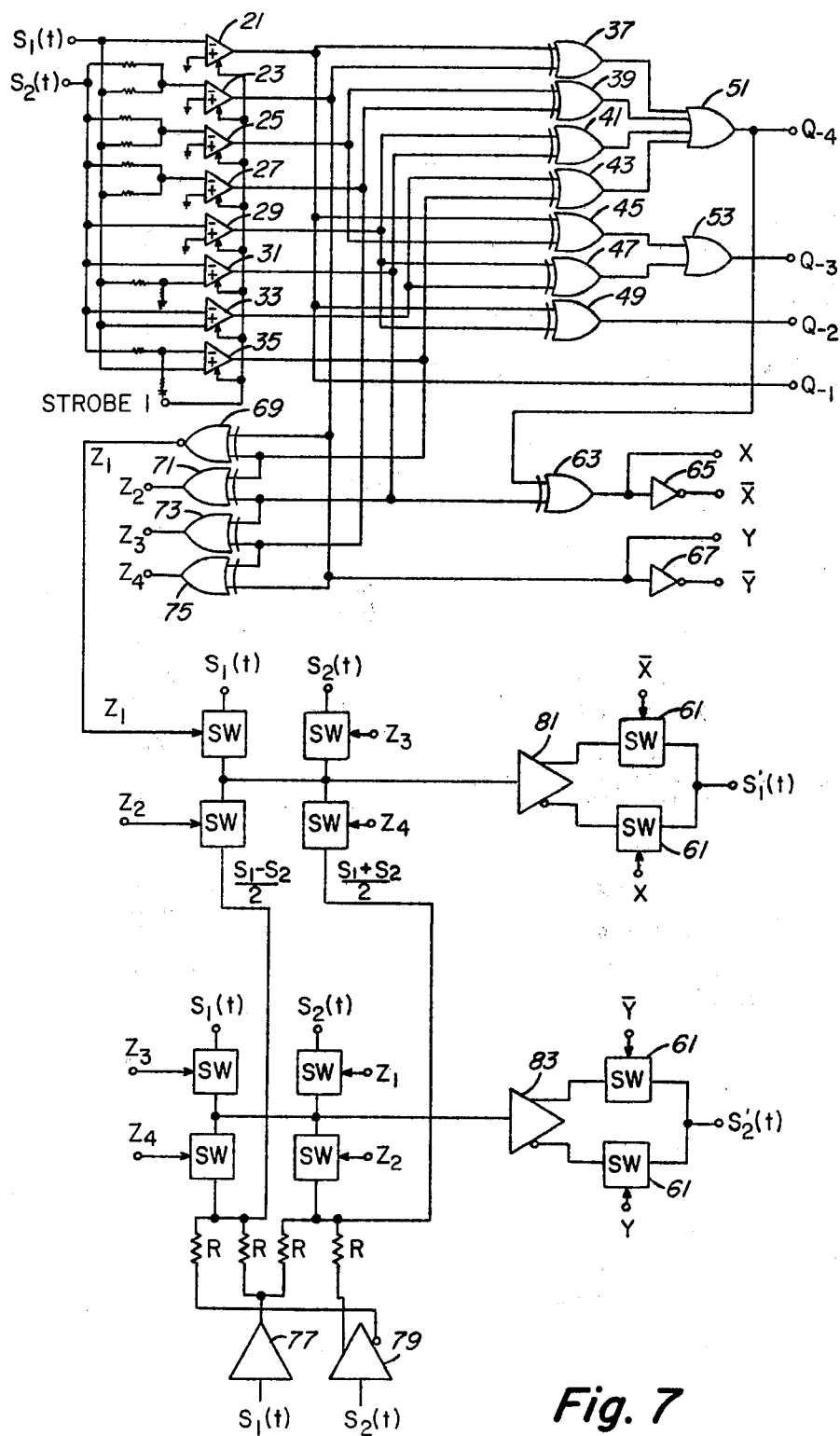
FIG. 7 is a circuit diagram of a four-bit first stage quadrature flash digitizer.

A first stage digitizer begins with basically the same structure as a full digitizer as may be seen by comparing the four bit digitizer shown in FIG. 3 with the four bit first stage digitizer shown in FIG. 7. As will be explained, the main reason for additional elements is to generate the signals $S_1'(t)$ and $S_2'(t)$ which represent an analog signal converted from the encoded four most significant bits $Q_{-1}$ through $Q_{-4}$. The first stage digitizer is formed essentially as a full digitizer. For example, parallel comparators 21, 23, 25, 27, 29, 31, 33, and 35 feed parallel exclusive OR gates 37, 39, 41, 43, 45, 47, and 49, which in turn feed parallel OR gates 51 and 53 in both the full four bit digitizer of FIG. 3 and the first stage digitizer of FIG. 7. In FIG. 7 the inputs to the parallel comparators 21-35 are the same or at least equivalently the same as the inputs to the parallel comparators 21-35 as shown in FIG. 3. In FIG. 7 an additional control signal denoted as STROBE 1 is applied to all of the parallel comparators 21-35. This strobing signal is used to eliminate possible ambiguities caused during signal level changes. Other alternative methods of doing same are well known in the art and such is the use of Schmitt triggers and other timing or clocking methods.

In addition to the circuitry of FIG. 3, FIG. 7 shows circuitry incorporated to generate the analog signals $S_1'(t)$ and $S_2'(t)$. Primary elements are analog switches 61 which function to pass an analog signal therethrough when an applied digital control signal is at a logical 1 level and to prevent the passage of the analog signal when the applied digital signal is at a logical 0. Eight digital control signals are required designated as x, $\bar{x}$, y, $\bar{y}$, $Z_1$, $Z_2$, $Z_3$, and $Z_4$. The control signal x is generated at the output of exclusive OR circuit 63 fed by the output of OR circuit 51 and the output of comparator 31. $\bar{x}$ is merely the inverted signal representation of x and is generated by inverter 65. The control signal y is generated as the output of comparator 23. The control signal $\bar{y}$ is the inverted representation of signal y as generated by inverter 67. Control signal $Z_1$ is generated as the negative output of exclusive OR circuit 69 fed by the outputs of comparators 23 and 35. The control signal $Z_2$ is generated as the output of exclusive OR 71 being fed by the outputs of comparators 31 and 35. The control signal $Z_3$ is generated as the output of exclusive OR 73 being fed by the outputs of comparators 27 and 31. Finally, the control signal $Z_4$ is generated as the output of exclusive OR 75 being fed by the outputs of comparators 23 and 27.

The quadrature analog signals $S_1(t)$ and $S_2(t)$ are fed through buffer 77 and buffer-inverter 79 and four resistors each designated as R to generate signals representing $(S_1-S_2)/2$ and also $(S_1+S_2)/2$. An absolute value circuit formed by buffer-inverter 81 and parallel switches 61 controlled by signals x and $\bar{x}$ generate the analog signal $S_1'(t)$. It is observed that other conventional means may be used to generate the absolute value signals. The buffer-inverter 83 operating in conjunction with parallel analog switches 61 controlled by signals y and $\bar{y}$ generate the analog signal $S_2'(t)$.

Figure 8:
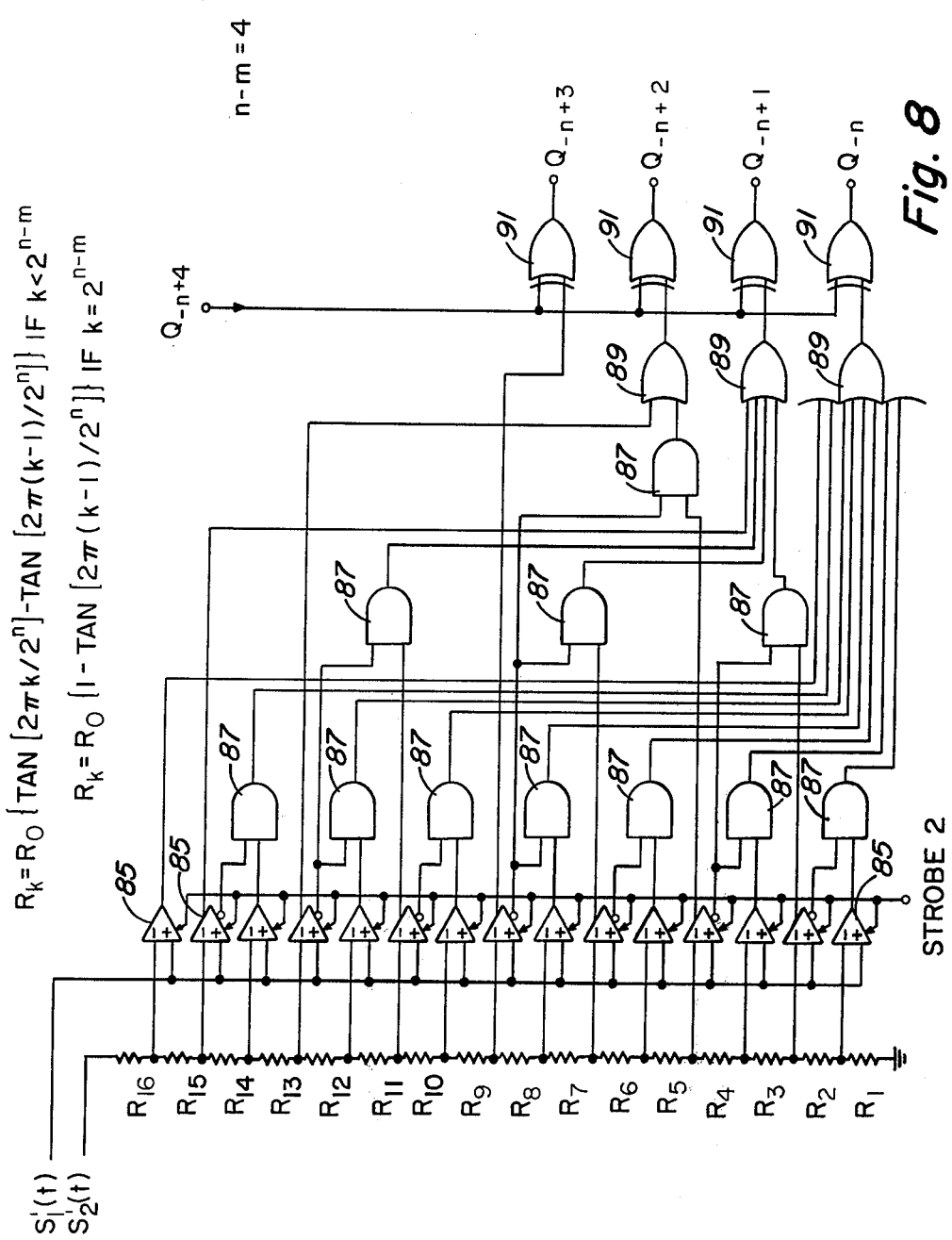
FIG. 8 is a circuit diagram of a four-bit second stage quadrature flash digitizer.

A four bit second stage quadrature digitizer can be fromed from a resistive divider $R_1$ through $R_{16}$, a plurality of parallel comparators 85, an array of AND gates 87, three OR gates 89 and four exclusive OR gates 91, see FIG. 8. The value of each resistor $R_k$ in the resistive divider $R_1$ through $R_{16}$ is determined as shown in FIG. 8 with $R_0$ being an arbitrary value. It is noted that "n" represents the total number of bits of the quadrature digitizers first and second stages while "m" represents the number of bits of the first stage. Thus, for the four bit first stage quadrature digitizer of FIG. 7 operating with the four bit quadrature digitizer second stage of FIG. 8, the value of "n" would be eight (8) and the value of "m" would be four (4). Also shown in FIG. 8 is a strobing signal designated as STROBE 2 applied to the parallel comparators 85. This strobing signal is applied after the values of $S_1'(t)$ and $S_2'(t)$ are applied to the comparator 85 and have "settled down." Obviously, other timing or clocking means may be used to remove any transient ambiguities if required or desired.

Having now seen how a specific quadrature digitizer may be sectioned into a first stage quadrature digitizer of four bits and a second stage quadrature digitizer of four bits, it is now appropriate to consider the construction in accordance with the invention of a generalized first and second stage quadrature digitizer for any number of bits in the first and second stages.

Figure 9:
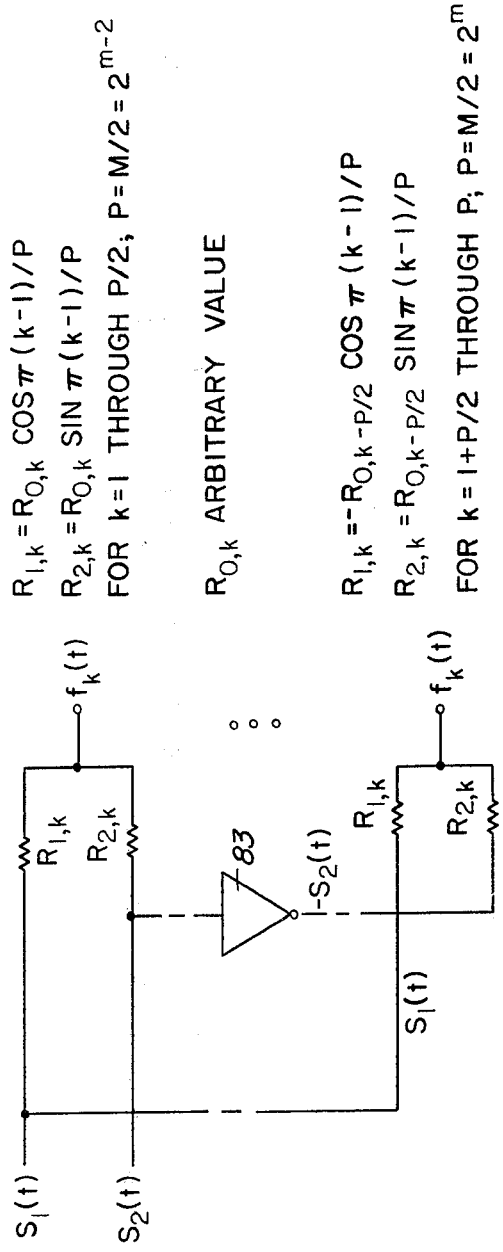
FIG. 9 is a circuit diagram of a circuit for generating the intermediate values of $f_k$ used in a generalized m bit first stage quadrature flash digitizer.

The generalized first stage quadrature digitizer generates intermediate values of $f_k(t)$ by means of a resistive network $R_{1,k}$ and $R_{2,k}$ and an inverter 83, see FIG. 9.

Figure 10:
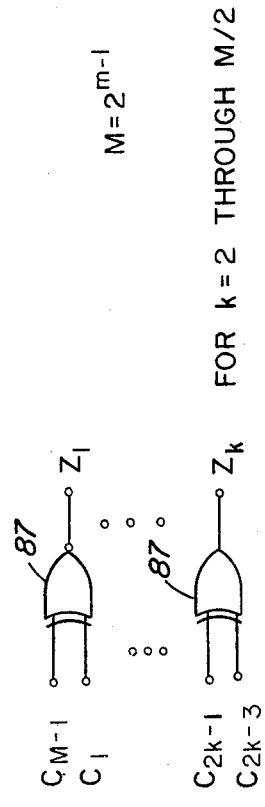
FIG. 10 is a logic diagram of a circuit for generating control values x, y, and z used in a generalized m bit first stage quadrature flash digitizer.

The values of $c_k$ generated as shown in FIG. 5 are used to create a plurality of control variables $z_1$ through $z_k$ through a plurality of parallel exclusive OR gates 87 as shown in FIG. 10.

Figure 11:
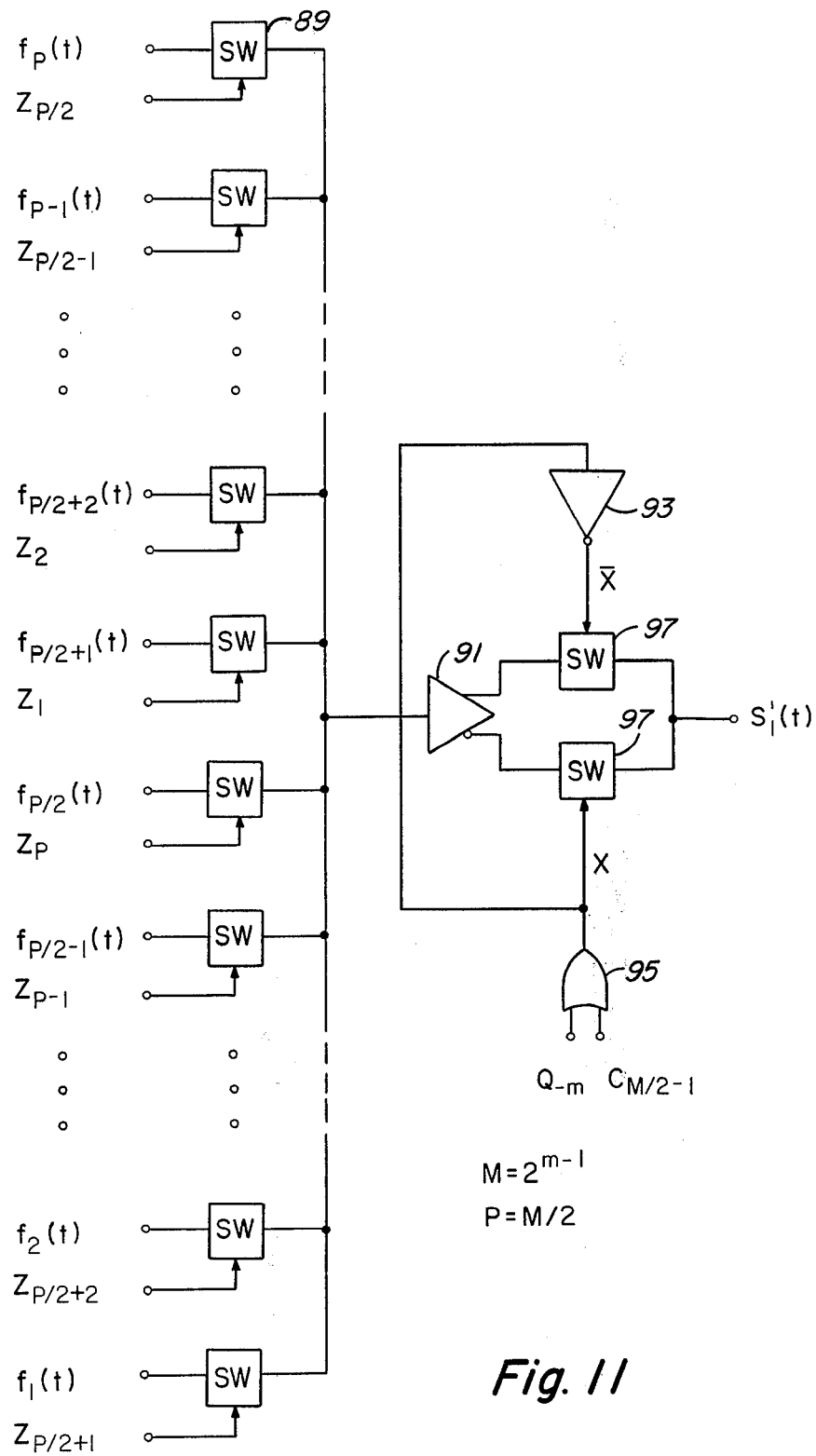
FIG. 11 is a circuit diagram of a circuit for generating $S'_1(t)$ with the intermediate and control values generated by the circuits of FIGS. 9 and 10.

The values of $z_k$ function as control signals to a plurality of analog switches 89 fed by the $f_k(t)$ signals generated by the circuitry of FIG. 9, see FIG. 11. Also shown in FIG. 11 is a buffer-inverter 91, an inverter 93, an OR circuit 95, and parallel analog switches 97 which when fed by the signals $Q_{-m}$ and $C_{M/2-1}$ generate the analog value $S_1'(t)$.

Figure 12:
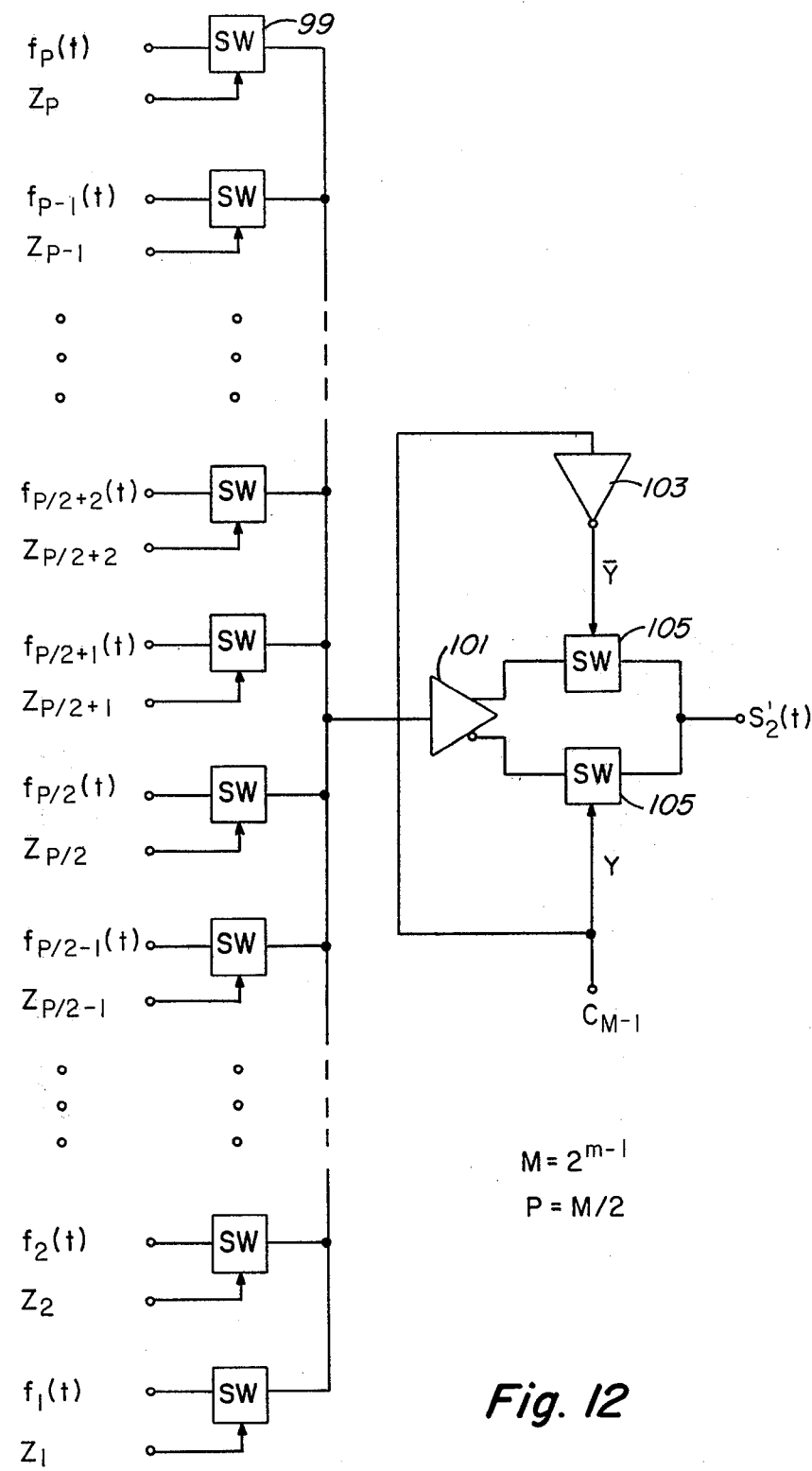
FIG. 12 is a circuit diagram of a circuit for generating $S'_2(t)$ with the intermediate and control values generated by the circuits of FIGS. 9 and 10.

$S_2'(t)$ is generated in a manner similar to the generation of $S_1'(t)$ through the operation of a parallel array of analog switches 99 and an absolute value generator consisting of a buffer-inverter 101, an inverter 103, and two analog switches 105, fed by the value $C_{M-1}$, see FIG. 12.

Figure 13:
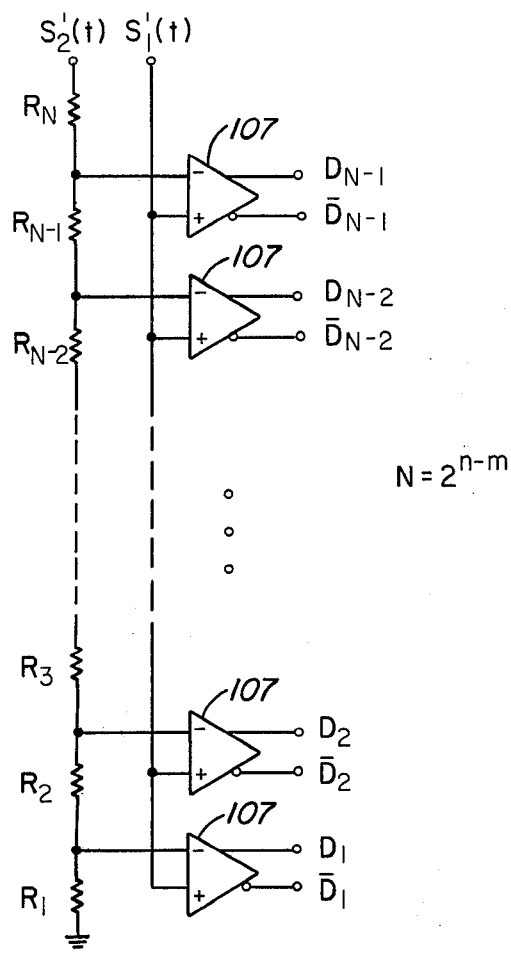
FIG. 13 is a circuit diagram of a circuit using the values of $S'_1(t)$ and $S'_2(t)$ generated by the circuits of FIGS. 11 and 12 to generate intermediate values for a generalized $n-m$ bit second stage quadrature digitizer.

The values of $S_1'(t)$ and $S_2'(t)$ are used in combination with a resistive divider $R_1$ through $R_N$ and a plurality of parallel buffer-inverters 107 to produce intermediate values of $D_1$ through $D_{N-1}$ and the logical inverses thereof, see FIG. 13.

Figure 14:
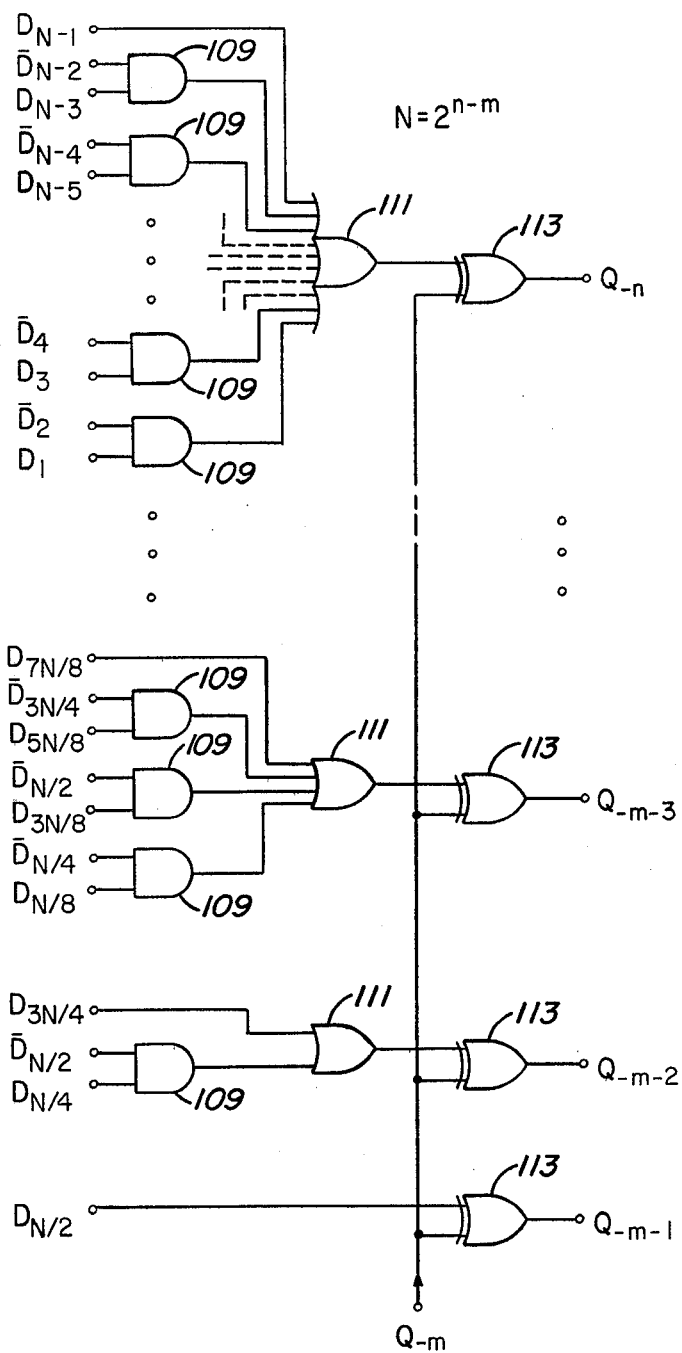
FIG. 14 is a logic diagram of a generalized $n-m$ bit second stage quadrature digitizer using the intermediate values generated by the circuit of FIG. 13.

The values of $D_1$ through $D_{N-1}$ generated by the circuitry shown in FIG. 13, are used with an array of AND gates 109 feeding an array of OR gates 111 feeding an array of exclusive OR gates 113 to generate the values of $Q_{-m-1}$ to $Q_{-n}$, see FIG. 14. This completes the generalized construction of a second stage quadrature digitizer for n bits.

As detailed above, a quadrature digitizer may be fabricated in accordance with the invention either as a single stage quadrature digitizer as shown in FIGS. 5 and 6 or as a two-stage quadrature digitizer shown in FIGS. 9-14. It is to be understood that as the number of bits or resolution of the quadrature digitizer increases, the advantages of the two stage digitizer in minimizing part count and complexity increases.

In order to encode the full revolutions of the quadrature phase angle $\phi(t)$ it is necessary to have a quadrature counter, see FIG. 1. In coding the $Q_n$'s for n greater than or equal to 0 requires a counting technique. The $Q_n$'s change state only when $S_2(t)$ is greater than 0 and the count should increase by one when $S_1(t)$ makes a negative to positive transition and decrease by one during a positive to negative transition. Problems arise in applying conventional counters to this counting method because a positive going transition and a negative going transition may occur arbitrarily close in time even if the band width of $S_1(t)$ is strictly limited. Up/down counters have a maximum counting rate and a finite time must elapse between an up and down count in order that both counts be properly registered. Following will be discussed two methods in which a conventional up/down counter may be converted to a quadrature counter and the design of a quadrature counter directly with refinements of a zero setting and presetting.

A conventional up/down counter 125 may be used in a circuit forming a quadrature up/down counter, see FIG. 15. The conventional up/down counter 125 may be fabricated from a conventionally available CD4029 CMOS synchronous up/down counter, or equivalent. A clocked input 127 provides the maximum clocking frequency at which the counter 125 can count reliably. The binary output 129 from the $S_1(t)$ comparator 131 is fed to a D flip-flop 133 during the rising edge of each clock pulse on the clock input 127. If the output Q of the D flip-flop 133 changes state, the exclusive OR gate 135 produces a positive pulse of duration (T) which is just long enough to trigger the up/down counter 125. The period T is determined by the delay (T) circuit 137 which may be fabricated from a delay line, a plurality of gates, or other conventional delay means. The up/down mode control 139 of the counter 125 is connected to the delay Q output. The counter 125 will count up or down depending upon the state of Q before the clock transition. Counting is inhibited when $S_2(t)$ is negative by a high level supplied from the $S_2(t)$ comparator 143 to the clock enable input 145 of the counter 125. The counter 125 is thus enabled to count correctly at the maximum reliable speed, and the outputs $Q_n$ thereof are synchronous with the clock input on line 127 rather than with the data input $S_1(t)$. This feature is advantageous if the data $Q_n$ is to be stored digitally, because then the data may be read at any submultiple of the clock frequency on line 127. To accomplish this, a divide by N counter 146 may be fed by clock input line 127 if desired.

A non-clocked quadrature up/down counter may also be formed with a conventional up/down counter 125, see FIG. 16. When an input datum appears at the D flip-flop 133 which is not equal to the Q output, a high level is generated by the exclusive OR gate 147. This high level will propagate through the AND gate 149 to the clock input 151 of the D flip-flop 133 setting the Q output thereof equal to the D input provided that the $\overline{Q'}$ output of a monostable multivibrator 153 is high. If the $\overline{Q'}$ output is not high, the clock pulse will be delayed a time less than or equal to $T_2$ which is the time period of the monostable multivibrator 153. When Q changes state, the exclusive OR gate 135 produces a pulse of the length $T_1$ generated by delay $T_1$ circuit 137, which triggers the counter 125 to count up or down depending upon the previous state of Q. When a count is initiated the monostable multivibrator 153 is triggered, preventing any additional counting events from occurring for a time period of $T_2$. It is necessary that $T_2$ be greater than or equal to $1/f_m$ where $f_m$ is the maximum reliable counting frequency for the counter 125, and $T_1$ must be just large enough to reliably trigger the counter 125. A problem occurs in timing in that the timing varies to some degree depending upon the transition made at the counter output $Q_n$. This is somewhat undesirable as substantial variations in propagation delay times occur.

Figure 17:
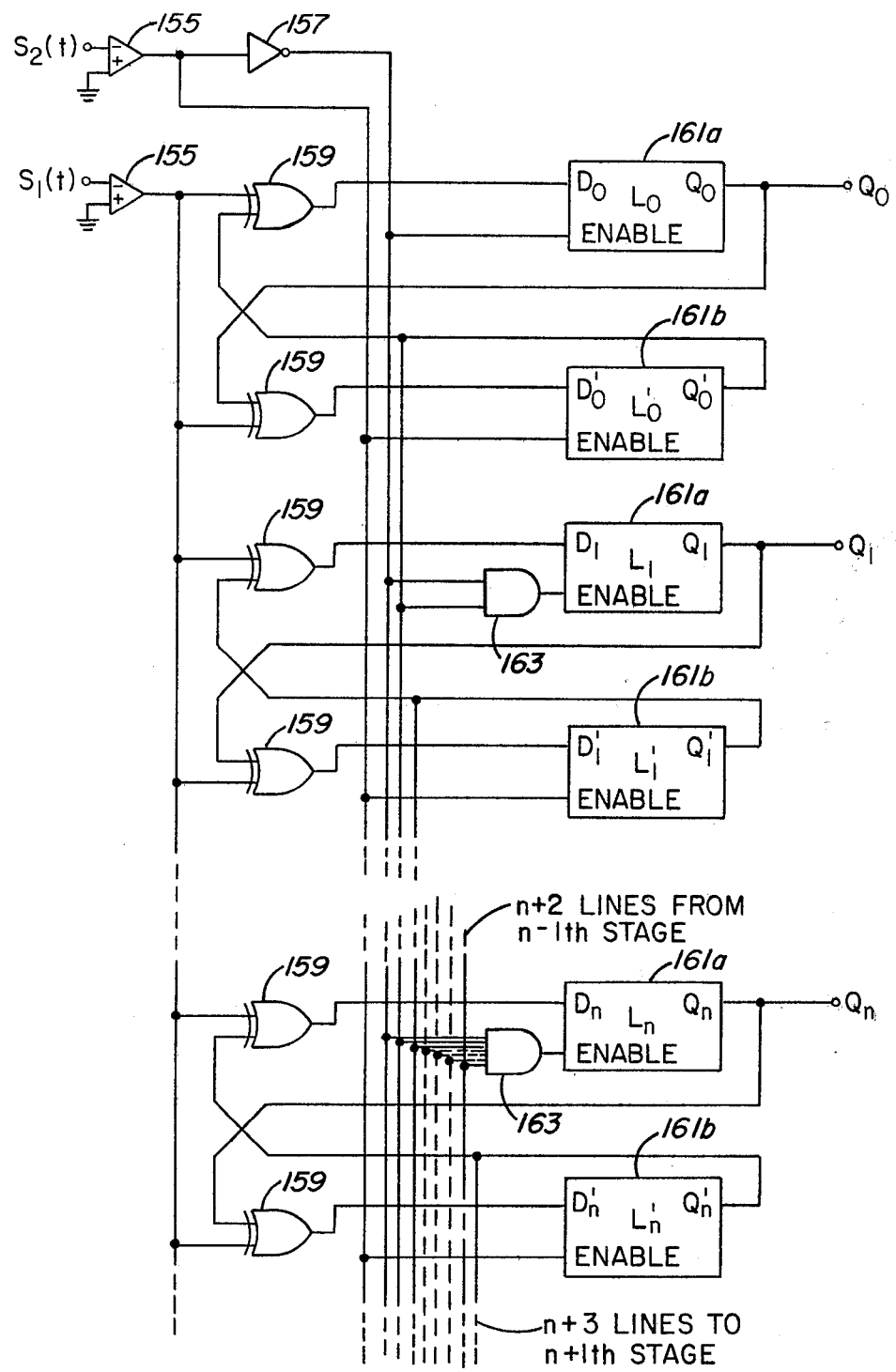
FIG. 17 is a circuit diagram of a synchronous quadrature up/down counter.

A preferred quadrature counter may be fabricated in accordance with the invention from two buffer analog comparators 155, an inverter 157, an array of exclusive OR gates 159, an array of parallel latch circuits 161a, and 161b and an array of enable driving AND gates 163, see FIG. 17. The $Q_n$ outputs are logically locked to the $S_1(t)$ input during the counting transition. Each $Q_n$ stages contains two D latches 161a and 161b. However, the D latches 161a and 161b are not connected in a conventional toggle configuration. The data inputs $D_n$ and $D_n'$ are fed by the exclusive OR gates 159 which cross couple the $Q_n'$ and $Q_n$ outputs with the $S_1(t)$ input. The latch enable inputs are controlled by the $S_2(t)$ input and by the $Q_n'$ outputs from the previous counter stages. Each of the $Q_n'$ outputs from the $L_n'$ latches 161b is set when $S_2(t)$ is less than 0 in such a way that the $Q_n$ outputs will not change state at the same time when the $L_n$ latches 161a become enabled. The enabling of the $L_n$ latches 161a causes the $Q_n$ outputs to be logically locked to the $S_1(t)$ input, changing state whenever $S_1(t)$ changes sign. Since the $L_n$ latches 161a are enabled only when $S_2(t)$ is greater that 0, the $Q_n$ outputs can change state only under the condition that $S_2(t)$ is greater than 0 and $S_1(t)$ changes sign, henceforth referred to as the counting condition. $Q_0$ always changes state when the counting condition occurs, counting up when $S_1(t)$ makes a negative to positive transition and counting down when the opposite transition occurs. $Q_n$ aways changes state when the counting condition occurs in conjunction with all $Q_k'$ outputs being high for $k=0$ to $k=n-1$. These two conditions imply that the $Q_k$'s are all equal for $k=0$ to $k=n-1$. Since these $Q_k$'s are either all zeros or all ones and are all changing state due to the addition or subtraction of a single count, a remainder must be generated which should be reflected in a change in the $Q_n$ output state, which is what in fact happens. Therefore, the circuit of FIG. 17 functions as a true synchronous quadrature up/down counter. The appropriate outputs all change synchronously since they are all locked to the input during the counting condition.

Figure 18:
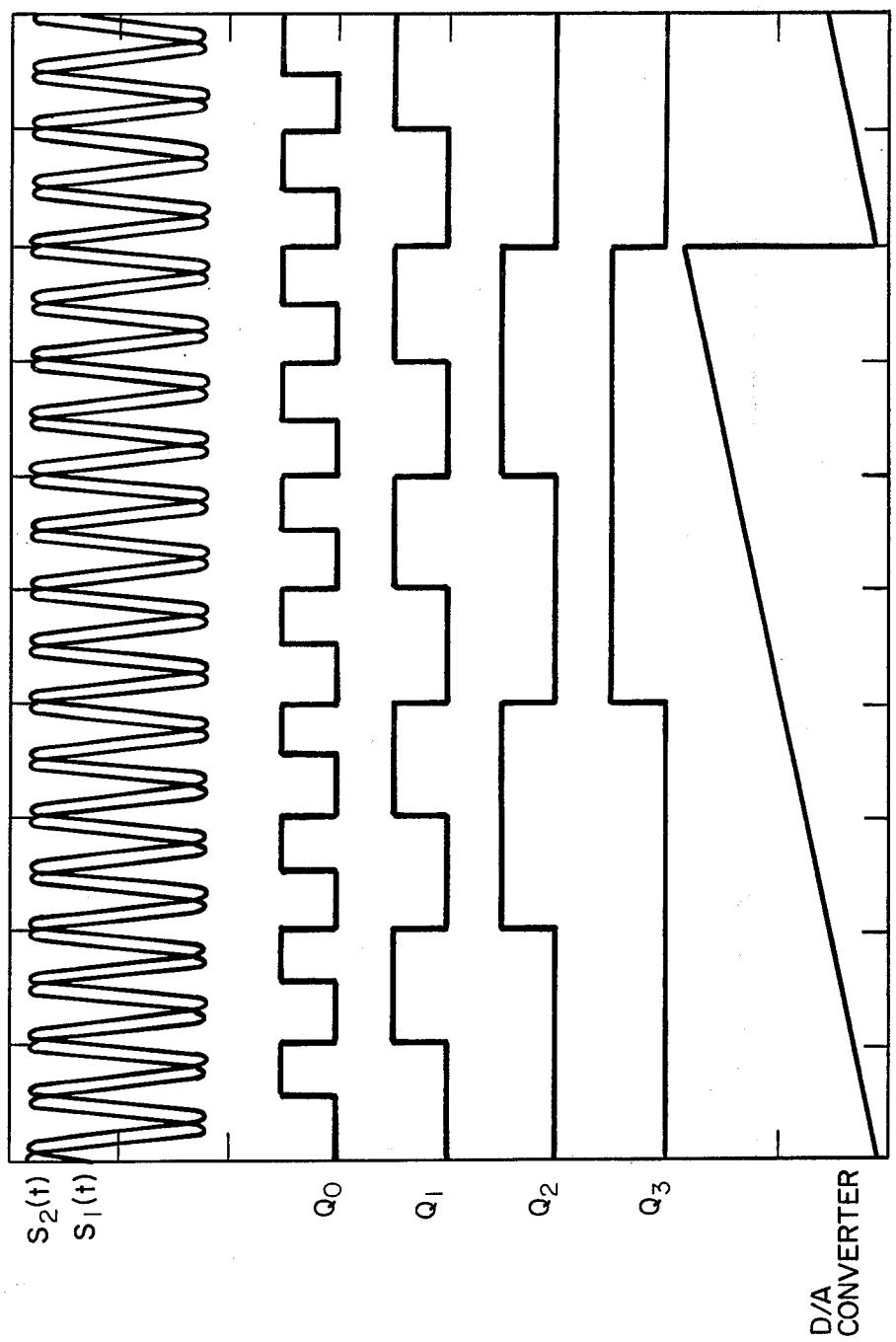
FIG. 18 is a timing diagram of the outputs of the synchronous quadrature up/down counter of FIG. 17 in response to quadrature inout signals $S_1(t)$ and $S_2(t)$.

This synchronous operation is shown in FIG. 18 for the circuit of FIG. 17 having four stages representing $Q_0$ through $Q_3$. Also, the optional digital-to-analog converter 19 output is also shown in FIG. 18 being fed by the quadrature digitizer 11 outputs as shown in FIG. 1.

Figure 19:
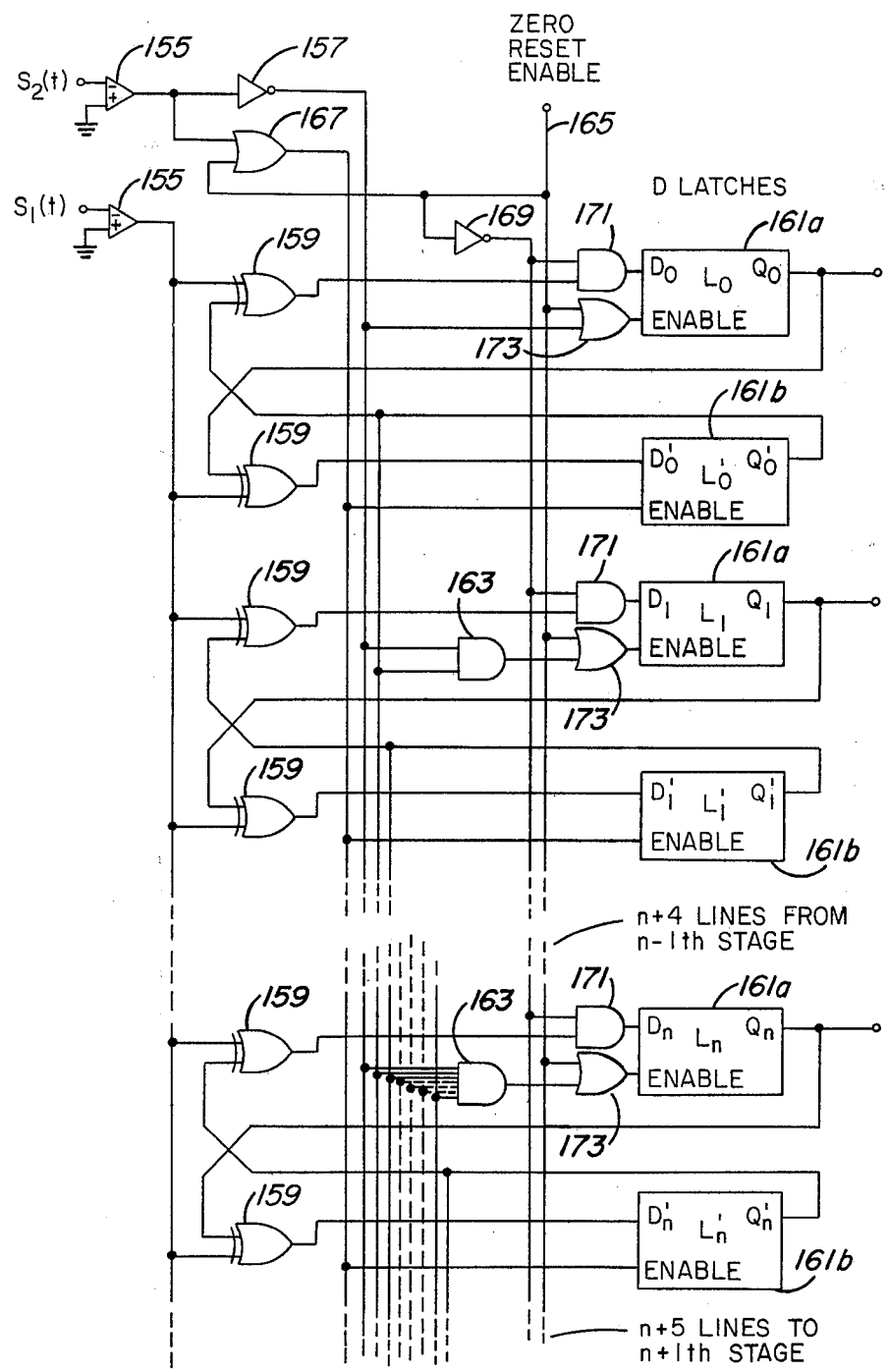
FIG. 19 is a circuit diagram of the synchronous quadrature up/down counter of FIG. 17 with zero set capability.

The synchronous quadrature up/down counter of FIG. 17 may be modified to include a zero reset enable 165, see FIG. 19. By comparing the counters of FIG. 17 and FIG. 19 it can be seen that the zero reset enable 165 requires merely the addition of an OR circuit 167 at the output of the analog comparator 155, a single inverter 169 at the zero reset enable line 165, an AND circuit 171 feeding the D input of each L latch 161 and an OR circuit 173 feeding the enable input of each L latch 161. Note that the second latch 161 designated as $L_n'$ does not require on its enable input the OR gate 173 and on its D' input the AND gate 171.

Figure 20:
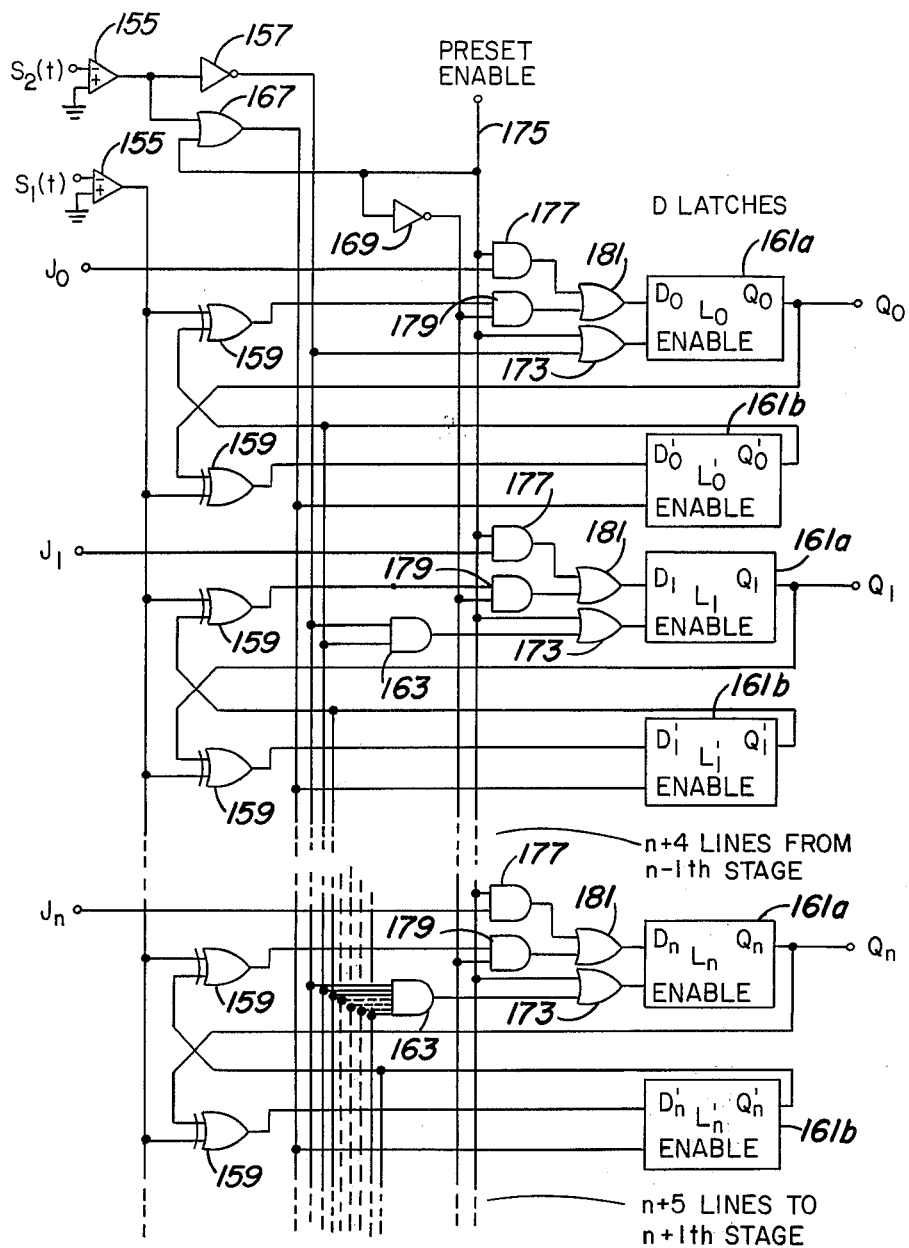
FIG. 20 is a circuit diagram of the synchronous quadrature up/down counter of FIG. 19 with pre-set capability.

The quadrature synchronous up/down counters of FIGS. 17 and 19 may be also modified to include a preset enable input 175, see FIG. 20. With reference to FIG. 19 and FIG. 20 it can be seen that such presetting capability is achieved by having $J_n$ inputs for each stage and by replacing the AND gate 171 in each stage with the AND gate 177 and 179 and the OR gate 181 for each stage. In the circuit of FIG. 20 when the preset enable line 175 is high, the latches 161 are set to whatever binary information is present on the $J_n$ inputs. Thus, a zero presetting may be achieved by merely setting all the $J_n$ inputs to zero or a separate zero reset enable circuit such as shown in FIG. 19 may also be also incorporated into the circuit of FIG. 20 if so desired. The ability to preset is of use to set the counter to a mid point so that the excursions of quadrature angle $\phi(t)$ will not cause the counter to count through its all zero or all one state thus causing counting ambiguities.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for deriving and digitally encoding the quadrature phase angle $\phi(t)$ of a pair of quadrature signals $S_1(t)$ and $S_2(t)$ where $S_1(t)=k(t)\sin\phi(t)$ and $S_2(t)=k(t)\cos\phi(t)$ and k(t) is a signal common to the pair of quadrature signals, said apparatus comprising:

quadrature digitizing means receiving $S_1(t)$ and $S_2(t)$ for real time generation of a signal indicating in binary format the fractional rotation excursions of $\phi(t)$; and quadrature up/down counting means receiving $S_1(t)$; and $S_2(t)$ for real time generation of a signal indicating in binary format the number of full rotation excursions of $\phi(t)$.

2. The apparatus according to claim 1 further including:

digital-to-analog conversion means receiving said signal generated by said quadrature digitizing means and said signal generated by said quadrature up/down counting means for conversion thereof to an analog output signal representing the quadrature phase angle $\phi(t)$.

3. The apparatus according to claim 1 wherein said quadrature digitizing means includes:

analog receiving means receiving $S_1(t)$ and $S_2(t)$, said analog receiving means for generating a plurality of parallel intermediate binary values; and digital outputting means receiving said plurality of parallel intermediate binary values, said digital outputting means for generating therefrom said signal indicating in binary format the fractional rotation excursions of $\phi(t)$.

4. The apparatus according to claim 1 wherein said quadrature digitizing means includes first means receiving $S_1(t)$ and $S_2(t)$, said first means for generating a plurality of first parallel intermediate binary logic levels;

second means fed by said plurality of first parallel intermediate binary logic levels, said second means for generating a plurality of second parallel intermediate binary logic levels; and third means fed by said plurality of second parallel intermediate binary logic levels, said third means for outputting said signal indicating in binary format the fractional rotation excursions of $\phi(t)$.

5. The apparatus according to claim 1 wherein said quadrature digitizing means includes:

first stage quadrature digitizing means receiving $S_1(t)$ and $S_2(t)$ for real time generation of a digital signal indicating in binary format the most significant bits of the fractional rotation excursions of $\phi(t)$ and for real time generation of two analog signals $S_1'(t)$ and $S_2'(t)$ representing respectively $S_1(t)$ and $S_2(t)$ minus each analog portion thereof digitized by said first stage quadrature digitizing means; and second stage quadrature digitizing means receiving $S_1'(t)$ and $S_2'(t)$ for real time generation of a digital signal indicating in binary format the least significant bits of the fractional rotation excursions of $\phi(t)$ whereby said digital signal generated by said first stage quadrature digitizing means and said digital signal generated by said second together completely indicate in binary format the fractional rotation excursions of $\phi(t)$.

6. The apparatus according to claim 5 wherein said most significant bits generated by said first stage quadrature digitizing means include in number at least three bits and wherein said least significant bits generated by said second stage quadrature digitizing means approximately equal in number the number of bits in said most significant bits generated by said first stage quadrature digitizing means.

7. The apparatus according to claim 5 wherein said first stage digitizing means includes:

first means receiving $S_1(t)$ and $S_2(t)$, for generating a plurality of parallel intermediate analog signals;

second means receiving $S_1(t)$ and $S_2(t)$, for generating a plurality of first parallel intermediate binary logic levels;

third means fed by said plurality of first parallel intermediate binary logic levels, said third means for generating a plurality of second parallel intermediate binary logic levels; an fourth means fed by said plurality of second parallel intermediate binary logic levels, said fourth means for outputting said digital signal indicating in binary format the most significant bits of the fractional rotation excursions of $\phi(t)$; and fifth means fed by said plurality of parallel intermediate analog signals and said plurality of second parallel intermediate logic levels, said fifth means for outputting said two analog signals $S_1'(t)$ and $S_2'(t)$.

8. The apparatus according to claim 5 wherein said second stage digitizing means includes:

analog receiving means receiving $S_1'(t)$ and $S_2'(t)$, for generating a plurality of parallel least significant bit intermediate binary logic levels; and digital outputting means receiving said plurality of parallel least significant bit intermediate binary logic levels, said digital outputting means for outputting said digital signal indicating in binary format the least significant bits of the fractional rotation excursions of $\phi(t)$.

9. The apparatus according to claim 7 wherein said second stage digitizing means includes:

analog receiving means receiving $S_1'(t)$ and $S_2'(t)$, for generating a plurality of parallel least significant bit intermediate binary logic levels; and digital outputting means receiving said plurality of parallel least significant bit intermediate binary logic levels, said digital outputting means for outputting said digital signal indicating in binary format the least significant bits of the fractional rotation excursions of $\phi(t)$.

10. The apparatus according to claim 1 wherein said quadrature up/down counting means includes:

a first analog comparator having a binary output and an input receiving thereon the quadrature signal $S_1(t)$;

a second analog comparator having a binary output and an input receiving thereon the quadrature signal $S_2(t)$;

a clocked D flip-flop having a D input and a Q output, said D input thereof being fed by said binary output of said first analog comparator;

delay means having an input and an output for introducing a delay of period T therebetween said input thereof being fed by said Q output of said clocked D flip-flop;

an exlusive OR circuit having an output, a first input fed by said Q output of said D flip-flop, and a second input fed by said output of said delay means; and an up/down counter having a clock input, an up/down mode control input, a clock enable input, and an output, said clock input fed by said output of said exclusive OR circuit, said up/down mode control fed by said output of said delay means said clock enable input fed by said binary output of said second analog comparator and said output of said up/down counter outputting said signal indicating in binary format the number of full rotation excursions of the quadrature phase angle $\phi(t)$.

11. The apparatus of claim 10 wherein said delay of period T of said delay means is a delay of just sufficient duration to assure reliable operation of said up/down counter.

12. The apparatus of claim 10 wherein said up/down counter. is an integrated circuit up/down counter.

13. The apparatus according to claim 1 wherein said quadrature up/down counting means includes:

a first analog comparator having a binary output and an input receiving thereon the quadrature signal $S_1(t)$;

a second analog comparator having a binary output and an input receiving thereon the quadrature signal $S_2(t)$;

a D flip-flop having a clock, a D input, and a Q output, said D input thereof being fed by said binary output of said first analog comparator;

delay means having an input and an output for introducing a delay of period $T_1$ therebetween, said input thereof being fed by said Q output of said clocked D flip-flop;

a first exclusive OR circuit having an output, a first input fed by said Q output of said D flip-flop, and a second input fed by said output of sid delay means;

a second exclusive OR circuit having an output, a first input fed by said Q output of said D flip-flop, and a second input fed by said binary output of said first analog comparator;

a monostable multivibrator having a clock input, a $\overline{Q}$ output and a stable period $T_2$, said clock input thereof fed by said output of said first exclusive OR circuit;

an AND gate having an output connected to said clock input of said D flip-flop, a first input fed by said output of said second exclusive OR circuit, and a second input fed by said $\overline{Q}$ output of said monostable multivibrator; and an up/down counter having a clock input, an up/down mode control input, a clock enable input, and an output, said clock input fed by said output of said first exclusive OR circuit, said up/down mode control fed by said ouput of said delay means, said clock enable input fed by said binary output of said second analog comparator and said output of said up/down counter outputting said signal indicating in binary format the number of full rotation excursions of the quadrature phase angle $\phi(t)$.

14. The apparatus of claim 13 wherein said delay of period $T_1$ of said delay means is a delay of just sufficient duration to assure reliable operation of said up/down counter.

15. The apparatus of claim 14 wherein said stable period $T_2$ of said monostable multivibrator is a period at least equal to unity divided by the maximum reliable counting frequency of said up/down counter.

16. The apparatus of claim 13 wherein said up/down counter is an integrated circuit up/down counter.

17. The apparatus according to claim 1 wherein said quadrature up/down counting means includes:

a first analog comparator having a binary output and an input receiving thereon the quadrature signal $S_1(t)$;

a second analog comparator having a binary output and an input receiving thereon the quadrature signal $S_2(t)$;

a logic inverter having an input fed by said binary output of said second analog comparator and a binary output for outputting the logic inverse of said binary output of said second analog comparator; and a plurality of ordered counting stages operating in parallel, each stage therein having a primary D latch circuit, a secondary D latch circuit, a primary exclusive OR circuit and a secondary exclusive OR circuit, each said primary and secondary D latch circuit having a D input, an enable input and a Q output, each said primary and secondary exclusive OR circuit having a first and a second input and an output, and within each stage;

said D input of said secondary D latch circuit is coupled to said output of said secondary exclusive OR circuit, said enable input of said secondary D latch circuit is coupled to said output of said second analog comparator, said Q output of said secondary D latch circuit is coupled to said first input of said primary exclusive OR circuit, said D input of said primary D latch is coupled to said output of said primary exclusive OR circuit, said enable input of said primary D latch circuit is fed by an ANDing together of said output of said logic inverter and said Q output of said secondary D latch circuit of each preceding stage in said plurality of ordered counting stages, said Q output of said primary D latch circuit is coupled to said first input of said secondary exclusive OR circuit, said second input of both said primary and said secondary exclusive OR circuits are coupled to said output of said first analog comparator;

whereby said Q output of said primary D latch circuit of each stage in said plurality of ordered counting stages provides a particularly ordered bit in said signal indicating in binary format the number of full rotation excursions of the quadrature phase angle $\phi(t)$.

18. A clocked quadrature up/down counting apparatus for real time generation of a signal indicating in binary format the number of full rotation excursions of the quadrature phase angle $\phi(t)$ of a pair of quadrature signals $S_1(t)$ and $S_2(t)$ where $S_1(t)\sin\phi(t)$ and $S_2(t)=k(t)\cos\phi(t)$ and k(t) is a signal common to the pair of quadrature signals, said apparatus comprising:
 a first analog comparator having a binary output and an input receiving thereon the quadrature signal $S_1(t)$;
 a second analog comparator having a binary output and an input receiving thereon the quadrature signal $S_2(t)$;
 a clocked D flip-flop having a D input and a Q output, said D input thereof being fed by said binary output of said first analog comparator;
 delay means having an input and an ouput for introducing a delay of period T therebetween, said input thereof being fed by said Q output of said clocked D flip-flop;
 an exclusive OR circuit having an output, a first input fed by said Q output of said D flip-flop, and a second input fed by said output of said delay means; and
 an up/down counter having a clock input, an up/down mode control input, a clock enable input, and an output, said clock input fed by said output of said exclusive OR circuit, said up/down mode control fed by said output of said delay means, said clock enable input fed by said binary output of said second analog comparator and said output of said up/down counter outputting said signal indicating in binary format the number of full rotation excursions of the quadrature phase angle $\phi(t)$.

19. The apparatus of claim 18 wherein said delay of period T of said delay means is a delay of just sufficient duration to assure reliable operation of said up/down counter.

20. The apparatus of claim 18 wherein said up/down counter is an integrated circuit up/down counter.

21. An quadrature up/down counting apparatus for real time generation of a signal indicating in binary format the number of full rotation excursions of the quadrature phase angle $\phi(t)$ of a pair of quadrature signals $S_1(t)$ and $S_2(t)$ where $S_1(t)=k(t)\sin\phi(t)$ and $S_2(t)=k(t)\cos\phi(t)$ and k(t) is a signal common to the pair of quadrature signals, said apparatus comprising:
 a first analog comparator having a binary output and an input receiving thereon the quadrature signal $S_1(t)$;
 a second analog comparator having a binary output and an input receiving thereon the quadrature signal $S_2(t)$;
 a D flip-flop having a clock input, a D input, and a Q ouput, said D input thereof being fed by said binary output of said first analog comparator;
 delay means having an input and an output for introducing a delay of period $T_1$ therebetween, said input thereof being fed by said Q output of said clocked D flip-flop;

a first exclusive OR circuit having an output, a first input fed by said Q output of said D flip-flop, and a second input fed by said output of said delay means;
 a second exclusive OR circuit having an output, a first input fed by said Q output of said D flip-flop, and a second input fed by said binary output of said first analog comparator;
 a monostable multivibrator having a clock input, a $\overline{Q}$ output and a stable period $T_2$, said clock input thereof fed by said output of said first exclusive OR circuit;
 an AND gate having an output connected to said clock input of said D flip-flop, a first input fed by said output of said second exclusive OR circuit, and a second input fed by said $\overline{Q}$ output of said monostable multivibrator; and
 an up/down counter having a clock input, an up/down mode control input, a clock enable input, and an output, said clock input fed by said output of said first exclusive OR circuit, said up/down mode control fed by said output of said delay means, said clock enable input fed by said binary output of said second analog comparator and said output of said up/down counter outputting said signal indicating in binary format the number of full rotation excursions of the quadrature phase angle $\phi(t)$.

22. The apparatus of claim 21 wherein said delay of period $T_1$ of said delay means is a delay of just sufficient duration to assure reliable operation of said up/down counter.

23. The apparatus of claim 22 wherein said stable period $T_2$ of said monostable multivibrator is a period at least equal to unity divided by the maximum reliable counting frequency of said up/down counter.

24. The apparatus of claim 21 wherein said up/down counter is an integrated circuit up/down counter.

25. A synchronous quadrature up/down counting apparatus for real time generation of a signal indicating in binary format the number of full rotation excursions of the quadrature phase angle $\phi(t)$ of a pair of quadrature signals $S_1(t)$ and $S_2(t)$ where $S_1(t)=k(t)\sin\phi(t)$ and $S_2(t)=k(t)\cos\phi(t)$ and k(t) is a signal common to the pair of quadrature signals, said apparatus comprising:
 a first analog comparator having a binary output and an input receiving thereon the quadrature signal $S_1(t)$;
 a second analog comparator having a binary output and an input receiving thereon the quadrature signal $S_2(t)$;
 a logic inverter having an input fed by said binary output of said second analog comparator and a binary output for outputting the logic inverse of said binary output of said second analog comparator; and
 a plurality of ordered counting stages operating in parallel, each stage therein having a primary D latch circuit, a secondary D latch circuit, a primary exclusive OR circuit and a secondary exclusive OR circuit, each said primary and secondary D latch circuit having a D input, an enable input and a Q output, each said primary and secondary exclusive OR circuit having a first and second input and an output, and within each stage;
 said D input of said secondary D latch circuit is coupled to said output of said secondary exclusive OR circuit, said enable input of said secondary D latch circuit is coupled to said output of said second analog comparator, said Q output of said secondary D latch circuit is coupled to said first input of said primary exclusive OR circuit, said D input of said primary D latch is coupled to said output of said primary exclusive OR circuit, said enable input of said primary D latch circuit is fed by an ANDing together of said output of said logic inverter and said Q output of said secondary D latch circuit of each preceding stage in said plurality of ordered counting stages, said Q output of said primary D latch circuit is coupled to said first input of said secondary exclusive OR circuit, said second input of both said primary and said secondary exclusive OR circuits are coupled to said output of said first analog comparator;

whereby said Q output of said primary D latch circuit of each stage in said plurality of ordered counting stages provides a particularly ordered bit in said signal indicating in binary format the number of full rotation excursions of the quadrature phase angle $\phi(t)$.

26. An apparatus for deriving and digitally encoding fractional rotation excursions of the quadrature phase angle $\phi(t)$ of a pair of quadrature signals $S_1(t)$ and $S_2(t)$ where $S_1(t) = k(t)\sin\phi(t)$ and $S_2(t) = k(t)\cos\phi(t)$ and k(t) is a signal common to the pair of quadrature signals, said apparatus comprising:

analog receiving means receiving $S_1(t)$ and $S_2(t)$, said analog receiving means for generating a plurality of parallel intermediate binary values; and digital outputting means receiving said plurality of parallel intermediate binary values, said digital outputting means for generating therefrom said signal indicating in binary format the fractional rotation excursions of $\phi(t)$.

27. An apparatus for deriving and digitally encoding the fractional rotation excursions of the quadrature phase angle $\phi(t)$ of a pair of quadrature signals $S_1(t)$ and $S_2(t)$ where $S_1(t) = k(t)\sin\phi(t)$ and $S_2(t) = k(t)\cos\phi(t)$ and k(t) is a signal common to the pair of quadrature signals, said apparatus comprising:

first means receiving $S_1(t)$ and $S_2(t)$, said first means for generating a plurality of first parallel intermediate binary logic levels;

second means fed by said plurality of first parallel intermediate binary logic levels, said second means for generating a plurality of second parallel intermediate binary logic levels; and third means fed by said plurality of second parallel intermediate binary logic levels, said third means for outputting said signal indicating in binary format the fractional rotation excursions of $\phi(t)$.

28. An apparatus for deriving and digitally encoding fractional rotation excursions of the quadrature phase angle $\phi(t)$ of a pair of quadrature signals $S_1(t)$ and $S_2(t)$ where $S_1(t) = k(t)\sin\phi(t)$ and $S_2(t) = k(t)\cos\phi(t)$ and k(t) is a signal common to the pair of quadrature signals, said apparatus comprising:

first stage quadrature digitizing means receiving $S_1(t)$ and $S_2(t)$ for real time generation of a digital signal indicating in binary format the most significant bits of the fractional rotation excursions of $\phi(t)$ and for real time generation of two analog signals $S_1'(t)$ and $S_2'(t)$ representing respectively $S_1(t)$ and $S_2(t)$ minus each analog portion thereof digitized by said first stage quadrature digitizing means; and second stage quadrature digitizing means receiving $S_1'(t)$ and $S_2'(t)$ for real time generation of a digital signal indicating in binary format the least significant bits of the fractional rotation excursions of $\phi(t)$ whereby said digital signal generated by said first stage quadrature digitizing means and said digital signal generated by said second together completely indicate in binary format the fractional rotation excursions of $\phi(t)$.

29. The apparatus according to claim 28 wherein said most significant bits generated by said first stage quadrature digitizing means include in number at least three bits and wherein said least significant bits generated by said second stage quadrature digitizing means approximately equal in number the number of bits in said most significant bits generated by said first stage quadrature digitizing means.

30. The apparatus according to claim 28 wherein said first stage digitizing means includes:

first means receiving $S_1(t)$ and $S_2(t)$, for generating a plurality of parallel intermediate analog signals;

second means receiving $S_1(t)$ and $S_2(t)$ for generating a plurality of first parallel intermediate binary logic levels; and third means fed by said plurality of first parallel intermediate binary logic levels, said third means for generating a pluarality of second parallel intermediate binary logic levels; and fourth means fed by said plurality of second parallel intermediate binary logic levels, said fourth means for outputting said digital signal indicating in binary format the most significant bits of the fractional rotation excursions of $\phi(t)$; and fifth means fed by said plurality of parallel intermediate analog signals and said plurality of second parallel intermediate logic levels, said fifth means for outputting said two analog signals $S_1'(t)$ and $S_2'(t)$.

31. The apparatus according to claim 28 wherein said second stage digitizing means includes:

analog receiving means receiving $S_1'(t)$ and $S_2'(t)$, for generating a plurality of parallel least significant bit intermediate binary logic levels; and digital outputting means receiving said plurality of parallel least significant bit intermediate binary logic levels, said digital outputting means for outputting said digital signal indicating in binary format the least significant bits of the fractional rotation excursions of $\phi(t)$.

* * * * *